(12) United States Patent
Kato et al.

(10) Patent No.: US 12,218,232 B2
(45) Date of Patent: Feb. 4, 2025

(54) SEMICONDUCTOR DEVICE INCLUDING COMPOUND AND NITRIDE MEMBERS

(71) Applicant: KABUSHIKI KAISHA TOSHIBA, Tokyo (JP)

(72) Inventors: Daimotsu Kato, Kawasaki (JP); Hiroshi Ono, Setagaya (JP); Yosuke Kajiwara, Yokohama (JP); Aya Shindome, Yokohama (JP); Akira Mukai, Kawasaki (JP); Po-Chin Huang, Bunkyo (JP); Masahiko Kuraguchi, Yokohama (JP); Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 403 days.

(21) Appl. No.: 17/652,971

(22) Filed: Mar. 1, 2022

(65) Prior Publication Data

US 2023/0061811 A1 Mar. 2, 2023

(30) Foreign Application Priority Data

Aug. 25, 2021 (JP) .................. 2021-136835
Jan. 7, 2022 (JP) .................. 2022-001346

(51) Int. Cl.
*H01L 29/04* (2006.01)
*H01L 29/20* (2006.01)
(Continued)

(52) U.S. Cl.
CPC .......... *H01L 29/7786* (2013.01); *H01L 29/04* (2013.01); *H01L 29/2003* (2013.01);
(Continued)

(58) Field of Classification Search
CPC . H01L 29/7786; H01L 29/04; H01L 29/2003; H01L 29/2006; H01L 29/4236;
(Continued)

(56) References Cited

U.S. PATENT DOCUMENTS

| 8,698,198 B2 | 4/2014 | Kuraguchi |
| 8,796,737 B2 | 8/2014 | Hwang et al. |

(Continued)

FOREIGN PATENT DOCUMENTS

| JP | 2008-103617 A | 5/2008 |
| JP | 2016-12708 A | 1/2016 |

(Continued)

OTHER PUBLICATIONS

Then et al., "Experimental Observation and Physics of "Negative" Capacitance and Steeper than 40mV/decade Subthreshold Swing in $Al_{0.83}In_{0.17}N/AlN/GaN$ MOS-HEMT on SiC Substrate", IEEE, 2013, IEDM13-691-694, 4 Pages.

(Continued)

*Primary Examiner* — Ida M Soward
(74) *Attorney, Agent, or Firm* — Oblon, McClelland, Maier & Neustadt, L.L.P.

(57) ABSTRACT

A semiconductor device includes first to third electrodes, a semiconductor member, first and second insulating members, a compound member, and a nitride member. The third electrode is between the first and second electrodes. The semiconductor member includes first and second semiconductor regions. The first semiconductor region includes first to fifth partial regions. The second semiconductor region includes first and second semiconductor portions.

The first insulating member includes first and second insulating portions. The first semiconductor portion is between the fourth partial region and the first insulating portion. The second semiconductor portion is between the fifth partial (Continued)

region and the second insulating portion. The compound member includes first to third compound portions. The nitride member includes first to third nitride portions. The second insulating member includes first and second insulating regions. The first and second insulating regions are between the nitride regions and the third electrode.

20 Claims, 4 Drawing Sheets

(51) Int. Cl.
    *H01L 29/778*     (2006.01)
    *H01L 29/423*     (2006.01)
    *H01L 29/51*     (2006.01)
    *H01L 29/66*     (2006.01)
    *H01L 29/792*     (2006.01)

(52) U.S. Cl.
CPC .... *H01L 29/2006* (2013.01); *H01L 29/42336* (2013.01); *H01L 29/42352* (2013.01); *H01L 29/511* (2013.01); *H01L 29/66833* (2013.01); *H01L 29/778* (2013.01); *H01L 29/7783* (2013.01); *H01L 29/792* (2013.01); *H01L 2924/13064* (2013.01)

(58) Field of Classification Search
CPC ......... H01L 29/42336; H01L 29/42352; H01L 29/511; H01L 29/778; H01L 29/7783; H01L 29/792; H01L 29/66833; H01L 2924/13064
See application file for complete search history.

(56) References Cited

U.S. PATENT DOCUMENTS

| | | | |
|---|---|---|---|
| 8,860,150 B2* | 10/2014 | Lin | H01L 29/7833 |
| | | | 257/407 |
| 9,450,063 B2 | 9/2016 | Prechtl | |
| 10,128,363 B2 | 11/2018 | Nakazawa et al. | |
| 11,276,774 B2* | 3/2022 | Shimizu | H01L 29/0878 |
| 2016/0225857 A1* | 8/2016 | Saito | H01L 21/0228 |
| 2016/0365435 A1 | 12/2016 | Then et al. | |
| 2017/0345919 A1 | 11/2017 | Oyama et al. | |
| 2018/0212046 A1* | 7/2018 | Koyama | H01L 29/1054 |
| 2019/0074174 A1* | 3/2019 | Okamoto | H01L 29/66462 |
| 2019/0115443 A1* | 4/2019 | Ramdani | H01L 29/402 |
| 2019/0131185 A1* | 5/2019 | Huang | H01L 29/518 |
| 2019/0348503 A1* | 11/2019 | Kimura | H01L 29/66462 |
| 2019/0348531 A1* | 11/2019 | Kimura | H01L 29/045 |
| 2020/0027976 A1* | 1/2020 | Mukai | H01L 29/66462 |
| 2020/0066859 A1* | 2/2020 | Ando | H01L 27/0924 |
| 2020/0144055 A1* | 5/2020 | Yoshida | H01L 29/0623 |
| 2020/0220003 A1* | 7/2020 | Kuraguchi | H01L 29/2003 |
| 2020/0295169 A1* | 9/2020 | Kato | H01L 29/66462 |
| 2020/0335587 A1* | 10/2020 | Ono | H01L 29/7786 |
| 2020/0411675 A1* | 12/2020 | Kato | H01L 29/513 |
| 2021/0005730 A1* | 1/2021 | Mukai | H01L 29/7786 |
| 2021/0043743 A1 | 2/2021 | Nogami | |
| 2021/0066486 A1* | 3/2021 | Kajiwara | H01L 29/1045 |
| 2021/0226019 A1* | 7/2021 | Takatani | H01L 29/7813 |
| 2022/0130986 A1* | 4/2022 | Kato | H01L 23/3171 |

FOREIGN PATENT DOCUMENTS

| | | |
|---|---|---|
| JP | 2017-509150 A | 3/2017 |
| JP | 6343807 B2 | 6/2018 |
| JP | 6470480 B1 | 2/2019 |
| JP | 2020-17577 A | 1/2020 |
| JP | 2020-150141 A | 9/2020 |
| WO | WO 2015/147802 A1 | 10/2015 |
| WO | WO 2016/103603 A1 | 6/2016 |

OTHER PUBLICATIONS

Cui et al., "Sub-60 mV/decade Switching via Hot Electron Transfer in Nanoscale GaN HEMTs", IEEE Electron Device Letters, vol. 41, No. 8, Aug. 2020, 4 Pages.

Zhou et al., "Schottky Source/Drain $Al_2O_3$/InAlN/GaN MIS-HEMT with Steep Sub-threshold Swing and High On/Off Current Ratio", IEEE Xplore, 2011, 4 Pages.

Salahuddin et al., "Use of Negative Capacitance to Provide. Voltage Amplification for Low Power Nanoscale Devices", Nano Letters vol. 8, No. 2, 2008, 6 Pages.

\* cited by examiner

SEMICONDUCTOR DEVICE INCLUDING COMPOUND AND NITRIDE MEMBERS

CROSS-REFERENCE TO RELATED APPLICATIONS

This application is based upon and claims the benefit of priority from Japanese Patent Application No. 2021-136835, filed on Aug. 25, 2021, and Japanese Patent Application No. 2022-001346, filed on Jan. 7, 2022; the entire contents of which are incorporated herein by reference.

FIELD

Embodiments described herein relate generally to a semiconductor device.

BACKGROUND

For example, there is a semiconductor device using a nitride semiconductor. Improvement of characteristics is desired in semiconductor devices.

DETAILED DESCRIPTION

Figure 1:
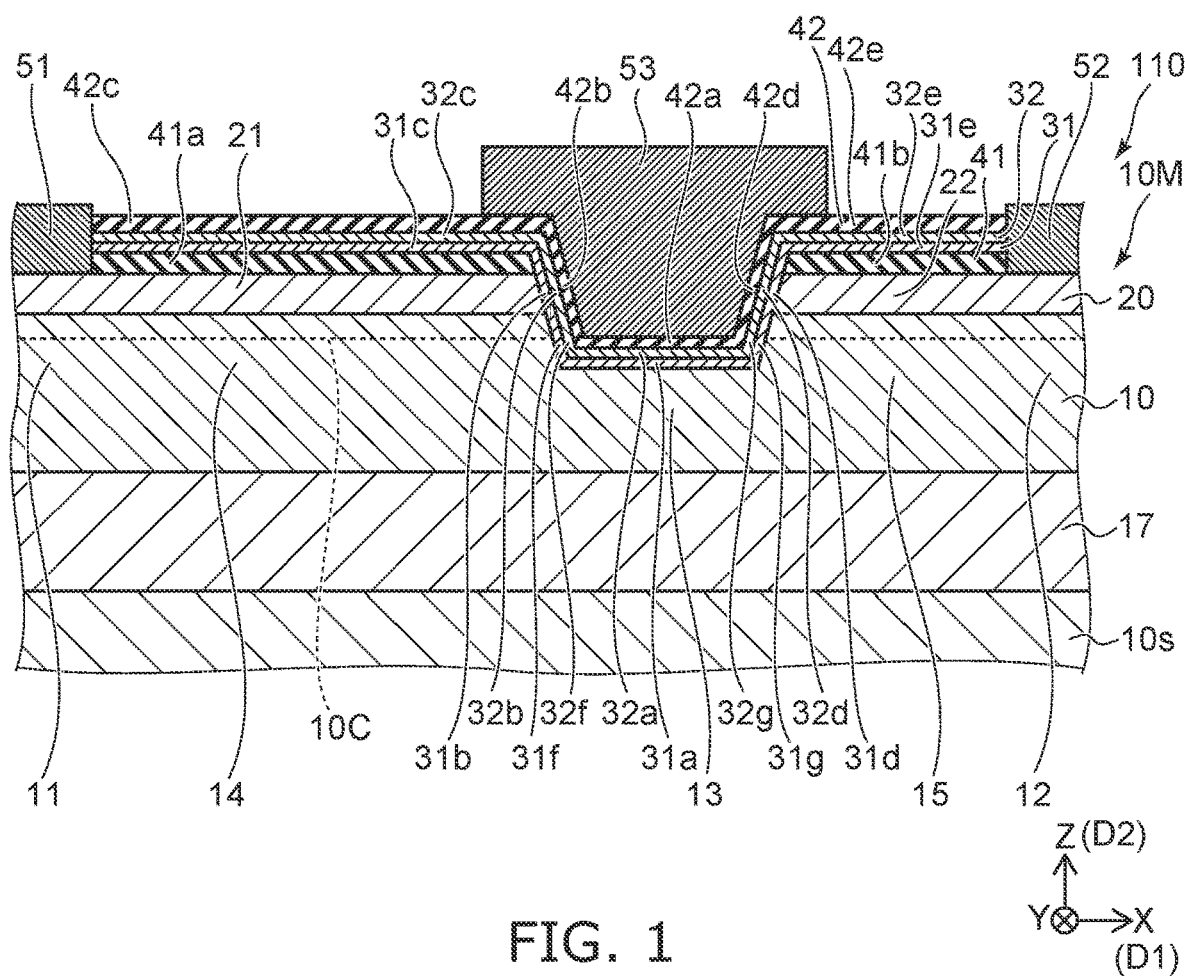
FIG. 1 is a schematic cross-sectional view illustrating a semiconductor device according to a first embodiment.

According to one embodiment, a semiconductor device includes a first electrode, a second electrode, a third electrode, a semiconductor member, a first insulating member, a second insulating member, a compound member, and a nitride member. A position of the third electrode in a first direction is between a position of the first electrode in the first direction and a position of the second electrode in the first direction. The first direction is from the first electrode toward the second electrode. The semiconductor member includes a first semiconductor region and a second semiconductor region. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A second direction from the first partial region toward the first electrode crosses the first direction. A direction from the second partial region toward the second electrode is along the second direction. A direction from the third partial region toward the third electrode is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 \leq 1$, $x1 < x2$). The second semiconductor region includes a first semiconductor portion and a second semiconductor portion. The first insulating member includes silicon and oxygen. The first insulating member includes a first insulating portion and a second insulating portion. The first semiconductor portion is between the fourth partial region and the first insulating portion. The second semiconductor portion is between the fifth partial region and the second insulating portion. The compound member includes $Al_{x3}Ga_{1-x3}N$ ($0 < x3 \leq 1$, $x1 < x3$). The compound member includes a first compound portion, a second compound portion, and a third compound portion. The nitride member includes $Al_{x4}Ga_{1-x4}N$ ($0 < x4 \leq 1$, $x1 < x4 < x3$) or $In_{y1}Al_{y2}Ga_{1-y1-y2}N$ ($0 < y1 \leq 1$, $0 \leq y2 < x3$, $y1+y2 \leq 1$). The nitride member includes a first nitride portion, a second nitride portion, and a third nitride portion. The first compound portion is between the third partial region and the third electrode in the second direction. The first nitride portion is between the first compound portion and the third electrode in the second direction. The second compound portion is between the first semiconductor portion and the third electrode in the first direction. The second nitride portion is between the second compound portion and the third electrode in the first direction. The first semiconductor portion is between the fourth partial region and the third nitride portion.

The third compound portion is between the first semiconductor portion and the third nitride portion. Crystallinity of the first compound portion is higher than crystallinity of the third compound portion. Crystallinity of the first nitride portion is higher than crystallinity of the third nitride portion. The second insulating member includes a first insulating region and a second insulating region. The first insulating region is between the first nitride portion and the third electrode in the second direction. The second insulating region is between the second nitride portion and the third electrode in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a semiconductor member 10M, a first insulating member 41, a second insulating member 42, a compound member 31, and a nitride member 32.

The direction from the first electrode 51 toward the second electrode 52 is taken as a first direction. The first direction is taken as an X-axis direction. One direction perpendicular to the X-axis direction is taken as a Z-axis direction. The direction perpendicular to the X-axis direction and the Z-axis direction is taken as a Y-axis direction.

The position of the third electrode 53 in the first direction D1 is between the position of the first electrode 51 in the first direction D1 and the position of the second electrode 52 in the first direction D1. For example, at least a portion of the third electrode 53 is between the first electrode 51 and the second electrode 52 in the first direction D1.

The semiconductor member 10M includes a first semiconductor region 10 and a second semiconductor region 20. In this example, the semiconductor device 110 includes a base 10s and a nitride semiconductor layer 17. The nitride semiconductor layer 17 is located between the base 10s and the semiconductor member 10M. For example, the nitride semiconductor layer 17 is located on the base 10s. The semiconductor member 10M is located on the nitride semiconductor layer 17. For example, the first semiconductor region 10 is located on the nitride semiconductor layer 17. The second semiconductor region 20 is located on the first semiconductor region 10. The first to third electrodes 51 to 53 are located on the semiconductor member 10M. The base 10s may be, for example, a silicon substrate or a SiC substrate. The nitride semiconductor layer 17 includes, for example, AlGaN.

The first semiconductor region 10 includes $Al_{x1}Ga_{1-x1}N$ ($0 \leq x1 < 1$). For example, the first semiconductor region 10 includes GaN. The first semiconductor region 10 includes a first partial region 11, a second partial region 12, a third partial region 13, a fourth partial region 14, and a fifth partial region 15. The second direction D2 from the first partial region 11 toward the first electrode 51 crosses the first direction D1. The second direction D2 may be, for example, the Z-axis direction.

The direction from the second partial region 12 toward the second electrode 52 is along the second direction D2. The direction from the third partial region 13 toward the third electrode 53 is along the second direction D2. The position of the fourth partial region 14 in the first direction D1 is between the position of the first partial region 11 in the first direction D1 and the position of the third partial region 13 in the first direction D1. The position of the fifth partial region 15 in the first direction D1 is between the position of the third partial region 13 in the first direction D1 and the position of the second partial region 12 in the first direction D1. For example, in the first direction D1 (X-axis direction), the fourth partial region 14 is between the first partial region 11 and the third partial region 13. For example, in the first direction D1, the fifth partial region 15 is between the third partial region 13 and the second partial region 12.

The first partial region 11 is a portion that overlaps the first electrode 51 in the Z-axis direction. The second partial region 12 is a portion that overlaps the second electrode 52 in the Z-axis direction. The third partial region 13 is a portion that overlaps the third electrode 53 in the Z-axis direction.

The second semiconductor region 20 includes $Al_{x2}Ga_{1-x2}N$ ($0 < x2 \leq 1$, $x1 < x2$). The second semiconductor region 20 includes, for example, GaN. The second semiconductor region 20 includes a first semiconductor portion 21 and a second semiconductor portion 22. The direction from the fourth partial region 14 to the first semiconductor portion 21 is along the second direction D2. The direction from the fifth partial region 15 to the second semiconductor portion 22 is along the second direction D2.

The first insulating member 41 includes silicon and nitrogen. The first insulating member 41 includes, for example, SiN. The first insulating member 41 includes a first insulating portion 41a and a second insulating portion 41b. The first semiconductor portion 21 is between the fourth partial region 14 and the first insulating portion 41a. The second semiconductor portion 22 is between the fifth partial region 15 and the second insulating portion 41b.

The compound member 31 includes $Al_{x3}Ga_{1-x3}N$ ($0 < x3 \leq 1$, $x1 < x3$). The compound member 31 includes, for example, AlN or AlGaN. The compound member 31 includes a first compound portion 31a, a second compound portion 31b, and a third compound portion 31c. For example, the first compound portion 31a is between the third partial region 13 and the third electrode 53 in the second direction D2. At least a portion of the second compound portion 31b is between the second semiconductor portion 21 and the third electrode 53 in the first direction D1.

The nitride member 32 includes $Al_{x4}Ga_{1-x4}N$ ($0 < x4 \leq 1$, $x1 < x4 < x3$). The nitride member 32 includes, for example, AlGaN. For example, the composition ratio x4 of Al in the nitride member 32 is lower than the composition ratio x2 of Al in the second semiconductor region 20.

The nitride member 32 includes a first nitride portion 32a, a second nitride portion 32b, and a third nitride portion 32c. The first compound portion 31a is between the third partial region 13 and the third electrode 53 in the second direction D2. The first nitride portion 32a is between the first compound portion 31a and the third electrode 53 in the second direction D2 (Z-axis direction). The second compound portion 31b is between the first semiconductor portion 21 and the third electrode 53 in the first direction D1 (X-axis direction). The second nitride portion 32b is between the second compound portion 31b and the third electrode 53 in the first direction D1.

The first semiconductor portion 21 is between the fourth partial region 14 and the third nitride portion 32c. The third compound portion 31c is between the first semiconductor portion 21 and the third nitride portion 32c.

In the embodiment, the crystallinity of the first compound portion 31a is higher than the crystallinity of the third compound portion 31c. The crystallinity of the first nitride portion 32a is higher than the crystallinity of the third nitride portion 32c.

The second insulating member 42 includes a first insulating region 42a and a second insulating region 42b. The first insulating region 42a is between the first nitride portion 32a and the third electrode 53 in the second direction D2. The second insulating region 42b is between the second nitride portion 32b and the third electrode 53 in the first direction D1.

A current flowing between the first electrode 51 and the second electrode 52 can be controlled by the potential of the third electrode 53. The potential of the third electrode 53 may be, for example, a potential based on the potential of the first electrode 51. For example, the first electrode 51 functions as one of a source electrode and a drain electrode. The second electrode 52 functions as the other of the source electrode and the drain electrode. The third electrode 53 functions as a gate electrode. The semiconductor device 110 is, for example, a transistor. When the first electrode 51 is the source electrode, for example, the distance between the first electrode 51 and the third electrode 53 is shorter than the distance between the third electrode 53 and the second electrode 52. In the following example, the first electrode 51 functions as the drain electrode, and the second electrode 52 functions as the source electrode.

A carrier region 10C is formed in a portion of the first semiconductor region 10 facing the second semiconductor region 20. The carrier region 10C is, for example, a two-dimensional electron gas. The semiconductor device 110 is, for example, a HEMT (high electron mobility transistor).

As described above, in the semiconductor device 110, the first semiconductor portion 21 is between the fourth partial region 14 and the third nitride portion 32c. The third compound portion 31c is between the first semiconductor portion 21 and the third nitride portion 32c. For example, the semiconductor member 10M is provided with a recess, and at least a portion of the third electrode 53 is filled in the recess. The semiconductor device 110 is a gate recess type transistor.

As described above, in the embodiment, the crystallinity of the compound member 31 and the nitride member 32 differs depending on the location. The crystallinity of the first compound portion 31a is higher than the crystallinity of the third compound portion 31c. The crystallinity of the first nitride portion 32a is higher than the crystallinity of the third nitride portion 32c. The crystallinity at the bottom of the recess is higher than the crystallinity at the outside of the recess. As a result, in the region between the third partial region 13 and the third electrode 53, the first compound portion 31a and the first nitride portion 32a affect the characteristics of the electric current. For example, it becomes easy to obtain a high threshold. The high crystallinity of the first compound portion 31a and the first nitride portion 32a makes it easy to obtain, for example, high channel mobility. For example, low on-resistance can be obtained.

On the other hand, the crystallinity of the third compound portion 31c and the third nitride portion 32c is low. As a result, the influence on the carrier region 10C can be suppressed in the region between the first electrode 51 and the third electrode 53 and the region between the third electrode 53 and the second electrode 52. This provides a low on-resistance. In the embodiment, the low on-resistance is obtained while obtaining a high threshold value. According to the embodiment, a semiconductor device capable of improving the characteristics is provided.

For example, a high voltage is applied between the third electrode 53 (gate electrode) and the second electrode 52 (drain electrode). This voltage may change the current characteristics. For example, the threshold value may change due to continuous application of voltage. It is considered that this is because the characteristics of the insulating member and the like change in the region between the third electrode 53 and the second electrode 52. For example, in the region between the third electrode 53 and the second electrode 52, a trap is formed in at least one of the insulating member (first insulating member 41 and the second insulating member 42), the compound member 31, or the nitride member 32. The current characteristics change depending on the trap. For example, high reliability may not be sufficiently obtained.

In the embodiment, the compound member 31 and the nitride member 32 are provided. The compound member 31 and the nitride member 32 can suppress, for example, oxidation of the third partial region 13. As a result, deterioration of a channel layer formed in the third partial region 13 can be suppressed when a voltage is applied to the third electrode 53. For example, the current characteristics due to the application of voltage can be suppressed. Fluctuations in the threshold voltage are suppressed. High reliability can be obtained.

A first reference example is conceivable in which the compound member 31 is provided and the nitride member 32 is not provided. In the first reference example, the compound member 31 is easily oxidized. A second reference example is conceivable in which the nitride member 32 is provided and the compound member 31 is not provided. In the second reference example, the compound member 31 is not oxidized. In the embodiment, the compound member 31 and the nitride member 32 are provided. This facilitates the formation of, for example, the two-dimensional electron gas of the channel layer formed in the third partial region 13.

In the embodiment, the compound member 31 and the nitride member 32 are provided. As a result, deterioration of the channel layer can be suppressed.

In embodiments, at least a portion of the first compound portion 31a includes crystals. At least a portion of the third compound portion 31c is amorphous. At least a portion of the first nitride portion 32a includes crystals. At least a portion of the third nitride portion 32c is amorphous.

For example, the crystallinity of the second compound portion 31b may be higher than the crystallinity of the third compound portion 31c. The crystallinity of the second nitride portion 32b may be higher than the crystallinity of the third nitride portion 32c.

For example, in the compound member 31 and the nitride member 32, the crystallinity becomes low in the region formed on the first insulating member 41 including silicon and nitrogen. For example, an amorphous layer is formed. High crystallinity can be obtained in the region formed in the recess of the semiconductor member 10M.

In the embodiment, the first compound portion 31a and the first nitride portion 32a are between the fourth partial region 14 and the fifth partial region 15 in the first direction D1.

In the embodiment, at least a portion of the first insulating region 42a is between the fourth partial region 14 and the fifth partial region 15 in the first direction D1. For example, at least a portion of the third electrode 53 may be between the fourth partial region 14 and the fifth partial region 15 in the first direction D1.

As shown in FIG. 1, the second insulating member 42 may further include a third insulating region 42c. The third nitride portion 32c is between the third compound portion 31c and the third insulating region 42c.

The second insulating member 42 includes, for example, silicon and oxygen. For example, the second insulating member 42 includes silicon oxide ($SiO_2$). For example, the second insulating member 42 does not include nitrogen. Alternatively, a concentration of nitrogen contained in the second insulating member 42 is lower than a concentration of nitrogen included in the first insulating member 41. For example, high reliability can be easily obtained.

As shown in FIG. 1, the compound member 31 may further include a fourth compound portion 31d and a fifth compound portion 31e. The nitride member 32 may further include a fourth nitride portion 32d and a fifth nitride portion 32e. The second insulating member 42 may further include a fourth insulating region 42d and a fifth insulating region 42e.

The fourth compound portion 31d is between the third electrode 53 and the second semiconductor portion 22 in the first direction D1. The fourth nitride portion 32d is between the third electrode 53 and the fourth compound portion 31d in the first direction D1.

The second semiconductor portion 22 is between the fifth partial region 15 and the fifth nitride portion 32e. The fifth compound portion 31e is between the second semiconductor portion 22 and the fifth nitride portion 32e. The fifth nitride portion 32e is between the fifth compound portion 31e and the fifth insulating region 42e. For example, the second semiconductor portion 22 is between the fifth partial region 15 and the fifth insulating region 42e. The fifth compound portion 31e is between the second semiconductor portion 22 and the fifth insulating region 42e.

For example, the crystallinity of the first compound portion 31a is higher than the crystallinity of the fifth compound portion 31e. The crystallinity of the first nitride portion 32a is higher than the crystallinity of the fifth nitride portion 32e. For example, the crystallinity of the fourth compound portion 31d is higher than the crystallinity of the fifth compound portion 31e. The crystallinity of the fourth nitride portion 32d is higher than the crystallinity of the fifth nitride portion 32e.

As shown in FIG. 1, the compound member 31 may further include a sixth compound portion 31f and a seventh compound portion 31g. The nitride member 32 may further include a sixth nitride portion 32f and a seventh nitride portion 32g. These portions correspond to the lower side of the recess.

The sixth compound portion 31f is between the fourth partial region 14 and the first insulating region 42a in the first direction D1. The sixth nitride portion 32f is between the sixth compound portion 31f and the first insulating region 42a in the first direction D1. The seventh compound portion 31g is between the first insulating region 42a and the fifth partial region 15 in the first direction D1. The seventh nitride portion 32g is between the first insulating region 42a and the seventh compound portion 31g in the first direction D1.

For example, the crystallinity of the sixth compound portion 31f is higher than the crystallinity of the third compound portion 31c. The crystallinity of the sixth nitride portion 32f is higher than the crystallinity of the third nitride portion 32c. The crystallinity of the 7th compound portion 31g is higher than the crystallinity of the 5th compound portion 31e. The crystallinity of the 7th nitride portion 32g is higher than the crystallinity of the 5th nitride portion 32e.

In the embodiment, the absolute value of the difference between the Al composition ratio x1 in the first semiconductor region 10 and the Al composition ratio x4 in the nitride member 32 is preferably more than 0 and not more 0.5. When the difference is 0, for example, the lattice constant difference between the compound member 31 and the nitride member 32 becomes large, and crystal defects such as misfit dislocations are easy to occur. When the difference is smaller than 0.5, for example, the difference in bandgap energy between the compound member 31 and the nitride member 32 and the difference in bandgap energy between the compound member 31 and the first semiconductor region 10 increase, and the compound member 31 functions as a barrier. This makes it easier to suppress electron injection or impurity intrusion. When the difference is larger than 0.5, the difference in bandgap energy between the compound member 31 and the nitride member 32 becomes small, electron injection or impurity intrusion is easy to occur, and gate reliability is easy to decrease.

The absolute value of the difference between the Al composition ratio x2 in the second semiconductor region 20 and the Al composition ratio x4 in the nitride member 32 is preferably not less than 0 and not more than 0.5. When the difference is smaller than 0.5, the difference in bandgap energy between the second semiconductor region 20 and the compound member 31 becomes excessively large, and the compound member 31 functions as a barrier, and thereby it becomes easy to prevent electrons from injecting and impurities from intruding. When the difference is larger than 0.5, the difference in bandgap energy between the second semiconductor region 20 and the compound member 31 becomes small, and the gate reliability tends to decrease.

The absolute value of the difference between the Al composition ratio x2 in the second semiconductor region 20 and the Al composition ratio x3 in the compound member 31 is preferably not less than 0 and not more than 0.8. When the difference is smaller than 0.8, the difference in bandgap energy between the second semiconductor region 20 and the compound member 31 becomes large, and the compound member 31 functions as a barrier, and thereby it becomes easy to suppress electron injection or impurity intrusion.

In one example, the composition ratio x1 is, for example, not less than 0 and less than 0.05. The composition ratio x2 is not less than 0.05 and not more than 0.3. The composition ratio x3 is, for example, more than 0.05 and not more than 1. The composition ratio x4 is more than 0 and less than 0.05.

Figure 2:
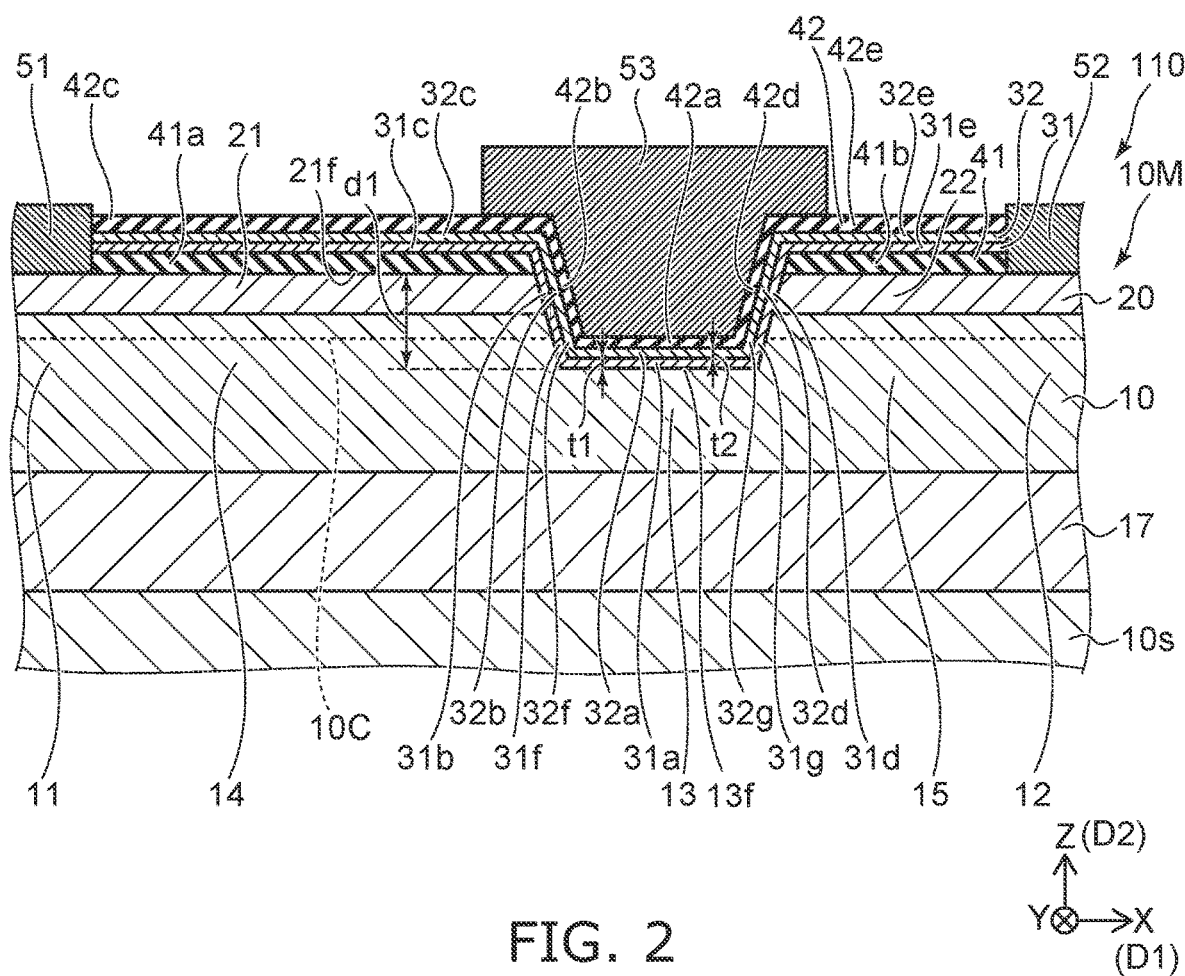
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, in the semiconductor device 110, the thickness of the first compound portion 31a along the second direction D2 is taken as a first thickness t1. In the embodiment, the first thickness t1 is preferably not less than 1 nm and not more than 10 nm. When the first thickness t1 is not less than 1 nm, for example, a uniform film can be easily obtained. When the first thickness t1 is not more than 10 nm, it becomes easy to suppress the formation of crystal defects such as misfit dislocations due to film stress.

The thickness of the first nitride portion 32a along the second direction D2 is taken as a second thickness t2. In the embodiment, the second thickness t2 is preferably not less than 1 nm and not more than 10 nm. When the second thickness t2 is not less than 1 nm, for example, a uniform film can be easily obtained. When the second thickness t2 is not more than 10 nm, it becomes easy to suppress the formation of crystal defects such as misfit dislocations due to film stress.

As shown in FIG. 2, the third partial region 13 includes a first surface 13f. The first surface 13f faces the first compound portion 31a, the second semiconductor portion 21 includes a second surface 21f, and the second surface 21f faces the first insulating portion 41a. The distance along the second direction D2 between the position along the second direction D2 of the first surface 13f and the position along the first direction D1 of the second surface 21f is taken as a distance d1. The distance d1 corresponds to the depth of the recess (recess depth). In the embodiment, the distance d1 is preferably not less than 60 nm. As a result, a positive threshold voltage can be stably obtained.

Figure 3:
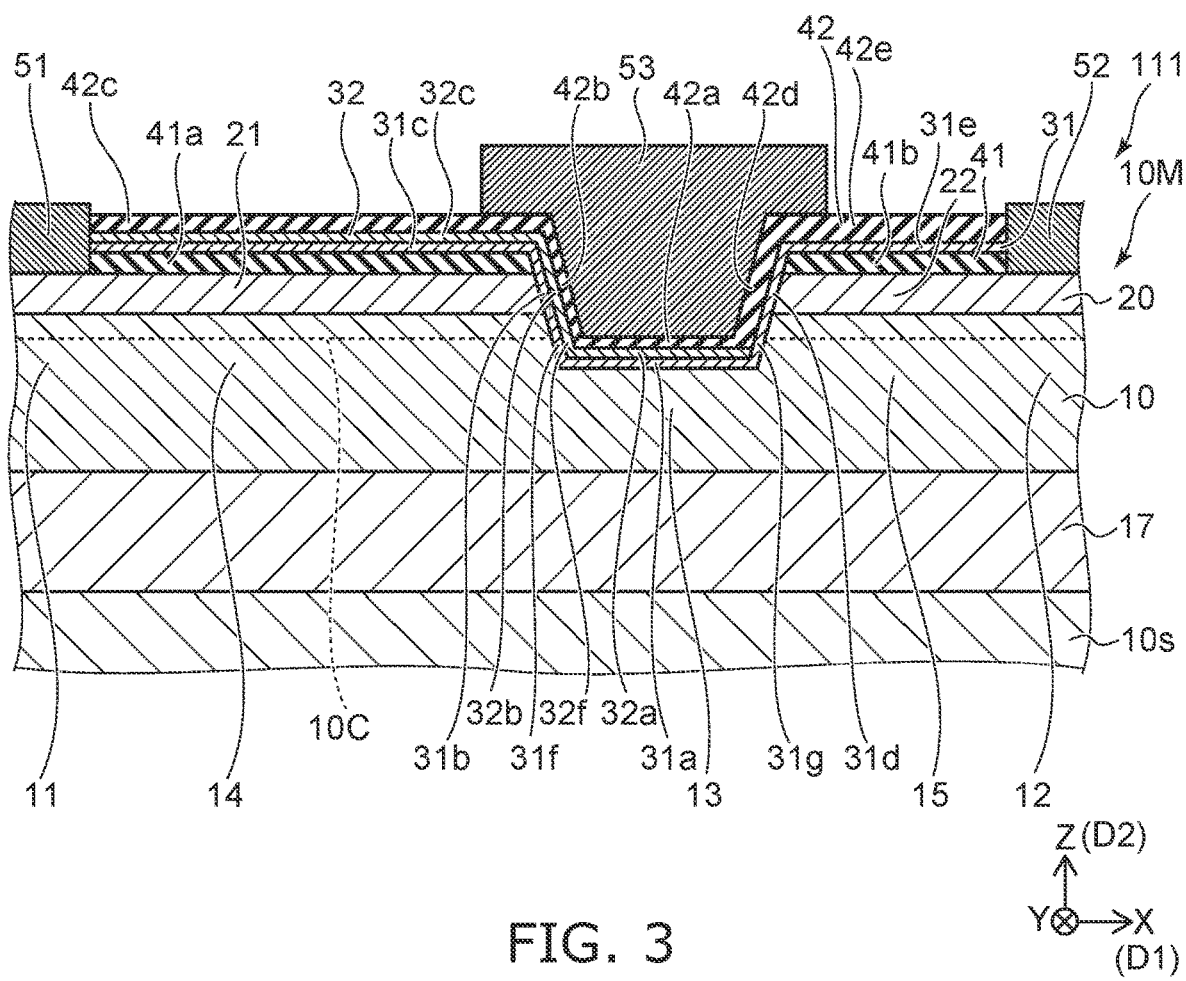
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, in the semiconductor device 111, the fourth nitride portion 32d and the fifth nitride portion 32e are omitted. Other configurations of the semiconductor device 111 may be the same as those of the semiconductor device 110. Even in the semiconductor device 111, a high threshold value can be stably obtained. A low on-resistance is obtained. Fluctuations in the threshold voltage are suppressed. A semiconductor device capable of improving characteristics is provided.

Second Embodiment

Figure 4:
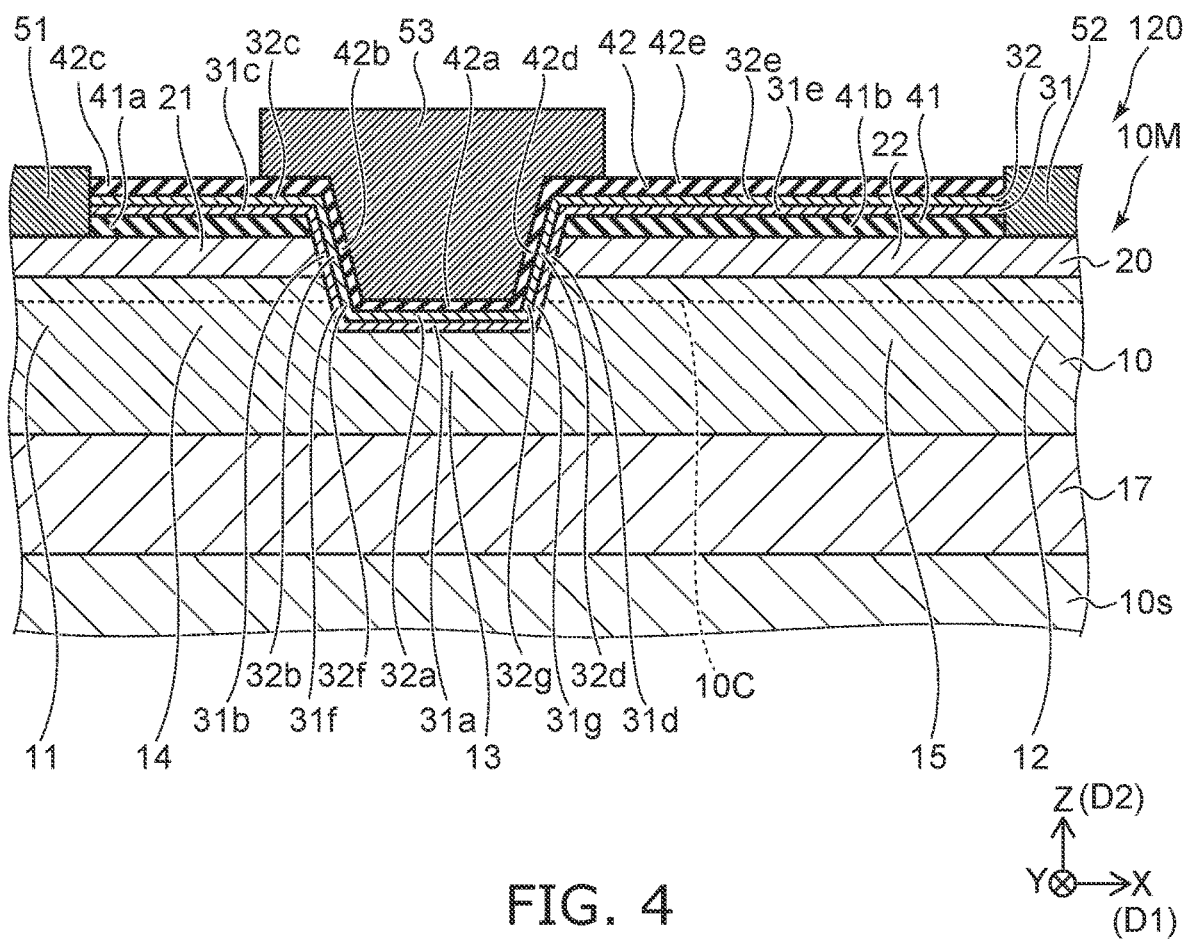
FIG. 4 is a schematic cross-sectional view illustrating a semiconductor device according to a second embodiment.

FIG. 4 is a schematic cross-sectional view illustrating a semiconductor device according to a second embodiment.

In a semiconductor device 120 according to the second embodiment, the distance between the first electrode 51 and the third electrode 53 is shorter than the distance between the third electrode 53 and the second electrode 52. The first electrode 51 functions as a source electrode. The second electrode 52 functions as a drain electrode. Other configurations of the semiconductor device 120 may be the same as the configuration of the semiconductor device 110. Even in the semiconductor device 111, a high threshold value can be stably obtained. A low on-resistance is obtained. Fluctuations in the threshold voltage are suppressed. A semiconductor device capable of improving characteristics is provided.

In embodiments, information about crystallinity is obtained, for example, by X-ray diffraction pattern images or the like. Information on the composition ratio can be obtained by, for example, X-ray photoelectron spectroscopy or the like.

In the embodiment, the nitride member 32 may include In, Ga and nitrogen. Also in this case, the crystallinity of the first compound portion 31a is higher than the crystallinity of the third compound portion 31c. The crystallinity of the first nitride portion 32a is higher than the crystallinity of the third nitride portion 32c. For example, it becomes easy to obtain a high threshold. The high crystallinity of the first compound portion 31a and the first nitride portion 32a makes it easy to obtain, for example, high channel mobility. For example, low on-resistance can be obtained. A semiconductor device capable of improving characteristics is provided. Fluctuations in the threshold voltage are suppressed. High reliability can be obtained.

That is, the nitride member 32 may include $Al_{x4}Ga_{1-x4}N$ ($0<x4\leq1$, $x1<x4<x3$) or $In_{y1}Al_{y2}Ga_{1-y1-y2}N$ ($0<y1\leq1$, $0\leq y2<x3$, $y1+y2\leq1$). For example, the nitride member 32 may include $In_{y1}Ga_{i1-y1}N$ ($0<y1\leq1$).

According to the embodiment, a semiconductor device capable of improving characteristics can be provided. In the specification, "nitride semiconductor" includes all compositions of semiconductors of the chemical formula $B_x In_y Al_z Ga_{1-x-y-z}N$ ($0\leq x\leq1$, $0\leq y\leq1$, $0\leq z\leq1$, and $x+y+z\leq1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor members, compound members, nitride members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode, a position of the third electrode in a first direction being between a position of the first electrode in the first direction and a position of the second electrode in the first direction, the first direction being from the first electrode toward the second electrode;
   a semiconductor member including a first semiconductor region and a second semiconductor region,
      the first semiconductor region including $Al_{x1}Ga_{1-x1}N$ ($0\leq x1<1$), the first semiconductor region including a first partial region, a second partial region, a third partial region, a fourth partial region, and a fifth partial region, a second direction from the first partial region toward the first electrode crossing the first direction, a direction from the second partial region toward the second electrode being along the second direction, a direction from the third partial region toward the third electrode being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction,
      the second semiconductor region including $Al_{x2}Ga_{1-x2}N$ ($0<x2\leq1$, $x1<x2$), the second semiconductor region including a first semiconductor portion and a second semiconductor portion;
   a first insulating member including silicon and oxygen, the first insulating member including a first insulating portion and a second insulating portion, the first semiconductor portion being between the fourth partial region and the first insulating portion, the second semiconductor portion being between the fifth partial region and the second insulating portion;
   a compound member including $Al_{x3}Ga_{1-x3}N$ ($0<x3\leq1$, $x1<x3$), the compound member including a first compound portion, a second compound portion, and a third compound portion;
   a nitride member including $Al_{x4}Ga_{1-x4}N$ ($0<x4\leq1$, $x1<x4<x_3$) or $In_{y1}Al_{y2}Ga_{1-y1-y2}N$ ($0<y1\leq1$, $0\leq y_2<x3$, $y1+y2\leq1$), the nitride member including a first nitride portion, a second nitride portion, and a third nitride portion,
      the first compound portion being between the third partial region and the third electrode in the second direction, the first nitride portion being between the first compound portion and the third electrode in the second direction, the second compound portion being between the first semiconductor portion and the third electrode in the first direction, the second nitride portion being between the second compound portion and the third electrode in the first direction, the first semiconductor portion being between the fourth partial region and the third nitride portion, the third compound portion being between the first semiconductor portion and the third nitride portion, crystallinity of the first compound portion being higher than crystallinity of the third compound portion, crystallinity of the first nitride portion being higher than crystallinity of the third nitride portion; and a second insulating member including a first insulating region and a second insulating region, the first insulating region being between the first nitride portion and the third electrode in the second direction, the second insulating region being between the second nitride portion and the third electrode in the first direction.

2. The device according to claim 1, wherein
at least a portion of the first compound portion includes crystals,
at least a portion of the third compound portion is amorphous,
at least a portion of the first nitride portion includes crystals,
at least a portion of the third nitride portion is amorphous.

3. The device according to claim 1, wherein
crystallinity of the second compound portion is higher than the crystallinity of the third compound portion.

4. The device according to claim 1, wherein
crystallinity of the second nitride portion is higher than the crystallinity of the third nitride portion.

5. The device according to claim 1, wherein
at least a portion of the first insulating region is between the fourth partial region and the fifth partial region in the first direction.

6. The device according to claim 1, wherein
at least a portion of the third electrode is between the fourth partial region and the fifth partial region in the first direction.

7. The device according to claim 1, wherein
the second insulating member further includes a third insulating region, and
the third nitride portion is between the third compound portion and the third insulating region.

8. The device according to claim 1, wherein
the compound member further includes a fourth compound portion and a fifth compound portion,
the nitride member further includes a fourth nitride portion and a fifth nitride portion,
the second insulating member further includes a fourth insulating region and a fifth insulating region,
the fourth compound portion is between the third electrode and the second semiconductor portion in the first direction, the fourth nitride portion is between the third electrode and the fourth compound portion in the first direction,
the second semiconductor portion is between the fifth partial region and the fifth nitride portion,
the fifth compound portion is between the second semiconductor portion and the fifth nitride portion, and
the fifth nitride portion is between the fifth compound portion and the fifth insulating region.

9. The device according to claim 8, wherein
the crystallinity of the first compound portion is higher than crystallinity of the fifth compound portion, and the crystallinity of the first nitride portion is higher than crystallinity of the fifth nitride portion.

10. The device according to claim 9, wherein
crystallinity of the fourth compound portion is higher than the crystallinity of the fifth compound portion, and crystallinity of the fourth nitride portion is higher than the crystallinity of the fifth nitride portion.

11. The device according to claim 1, wherein
the compound member further includes a sixth compound portion and a seventh compound portion,
the nitride member further include a sixth nitride portion and a seventh nitride portion,
the sixth compound portion is between the fourth partial region and the first insulating region in the first direction,
the sixth nitride portion is between the sixth compound portion and the first insulating region in the first direction,
the seventh compound portion is between the first insulating region and the fifth partial region in the first direction, and
the seventh nitride portion is between the first insulating region and the seventh compound portion in the first direction.

12. The device according to claim 1, wherein
the second insulating member includes silicon and oxygen,
the second insulating member does not include nitrogen, alternatively
a concentration of nitrogen included in the second insulating member is lower than a concentration of nitrogen included in the first insulating member.

13. The device according to claim 1, wherein
a thickness of the first compound portion along the second direction is not less than 1 nm and not more than 10 nm.

14. The device according to claim 1, wherein
a thickness of the first nitride portion along the second direction is not less than 1 nm and not more than 10 nm.

15. The device according to claim 1, wherein
the third partial region includes a first surface facing the first compound portion,
the second semiconductor portion includes a second surface facing the first insulating portion, and
a distance along the second direction between a position of the first surface along the second direction and a position of the second surface along the second direction is not less than 60 nm.

16. The device according to claim 1, wherein
the x4 is lower than the x2.

17. The device according to claim 1, wherein
an absolute value of a difference between the x1 and the x4 is more than 0 and not more than 0.5.

18. The device according to claim 1, wherein
an absolute value of a difference between the x2 and the x4 is not less than 0 and not more than 0.5.

19. The device according to claim 1, wherein
an absolute value of a difference between the x2 and the x3 is not less than 0 and not more than 0.8.

20. The device according to claim 1, wherein
the x1 is not less than 0 and less than 0.05,
the x2 is not less than 0.05 and not more than 0.3, and
the x3 is more than 0.05 and not more than 1.

* * * * *